United States Patent
Nurmi

(10) Patent No.: US 6,696,639 B1
(45) Date of Patent: Feb. 24, 2004

(54) PROTECTING DEVICE AGAINST INTERFERING ELECTROMAGNETIC RADIATION COMPRISING EMI-GASKETS

(75) Inventor: Reijo Nurmi, Oulu (FI)

(73) Assignee: Nokia Corporation, Espoo (FI)

( * ) Notice: Subject to any disclaimer, the term of this patent is extended or adjusted under 35 U.S.C. 154(b) by 6 days.

(21) Appl. No.: 10/018,035

(22) PCT Filed: Jun. 22, 2000

(86) PCT No.: PCT/FI00/00568

§ 371 (c)(1),
(2), (4) Date: Feb. 4, 2002

(87) PCT Pub. No.: WO01/01743

PCT Pub. Date: Jan. 4, 2001

(30) Foreign Application Priority Data

Jun. 24, 1999 (FI) .................................................. 991456

(51) Int. Cl.⁷ ............................................... H05K 9/00
(52) U.S. Cl. .................................. 174/35 GC; 277/920
(58) Field of Search .......................... 174/35 GC, 35 R; 277/920; 361/816, 818

(56) References Cited

U.S. PATENT DOCUMENTS

| | | | |
|---|---|---|---|
| 2,604,507 A | * 7/1952 | Tyson .................... | 174/35 GC |
| 3,011,775 A | 12/1961 | MacLeod ....................... | 267/1 |
| 3,502,784 A | 3/1970 | Kunkel | |
| 3,904,810 A | 9/1975 | Kraus | |
| 4,529,257 A | 7/1985 | Goodman et al. ............. | 339/94 |
| 4,564,722 A | 1/1986 | Nordin | |
| 4,572,921 A | 2/1986 | May et al. | |
| 4,780,570 A | 10/1988 | Chuck | |
| 4,788,381 A | 11/1988 | Nilsson ....................... | 174/35 |
| 4,794,206 A | 12/1988 | Weinstein | |
| 4,929,802 A | 5/1990 | Schaepers et al. | |
| 5,029,254 A | 7/1991 | Stickney | |
| 5,091,606 A | 2/1992 | Balsells ........................ | 174/35 |
| 5,134,244 A | * 7/1992 | Balsells .................. | 174/35 GC |
| 5,223,670 A | 6/1993 | Hogan et al. | |
| 5,313,016 A | 5/1994 | Brusati et al. | |
| 5,474,309 A | 12/1995 | Balsells | |
| 5,502,784 A | 3/1996 | Rondeau | |
| 5,545,843 A | 8/1996 | Arvidsson et al. | |
| 5,581,048 A | 12/1996 | Shores ......................... | 174/35 |
| 5,603,514 A | * 2/1997 | Jencks et al. ................ | 277/230 |
| 5,770,822 A | 6/1998 | Abolitz et al. | |
| 5,885,118 A | 3/1999 | Billenstein et al. | |
| 5,959,244 A | 9/1999 | Mayer | |
| 6,182,835 B1 | 2/2001 | Chen | |

FOREIGN PATENT DOCUMENTS

| | | | |
|---|---|---|---|
| CH | 668 527 | 10/1985 | |
| DE | 1849258 | 4/1962 | |
| DE | 197 01 690 | 7/1998 | |
| EP | 0 447 628 | 11/1990 | ............ H05K/9/00 |
| EP | 0 889 686 | 6/1998 | |
| GB | 1 505 579 | 3/1978 | |
| GB | 2 222 913 | 3/1990 | ............ H05K/9/00 |
| JP | 56-158202 | 5/1981 | ............ B21B/1/16 |
| JP | 10-173382 | 6/1998 | |
| WO | WO 94/30035 | 12/1994 | |

* cited by examiner

Primary Examiner—Hung V. Ngo
(74) Attorney, Agent, or Firm—Cohen, Pontani, Lieberman & Pavane

(57) ABSTRACT

The object of the invention is an elongated EMI gasket (electromagnetic interference), made from an electroconductive material, which is characterised in that the cross-section of said wire (20–23) comprises a shape (24,25, 27) that protrudes from a specific basic cross-section. The object of the invention is also a device wherein the EMI gasket is installed at a joining point between different parts of the device for preventing electromagnetic interference from penetrating said joining point. The shape (24, 25, 27) that protrudes from the specific basic cross-section presses effectively against the joint surfaces forming a permanent contact between the joint surfaces.

10 Claims, 6 Drawing Sheets

PROTECTING DEVICE AGAINST INTERFERING ELECTROMAGNETIC RADIATION COMPRISING EMI-GASKETS

PRIORITY CLAIM

This is a national stage of PCT application No. PCT/FI00/00568, filed on Jun. 22, 2000. Priority is claimed on that application and on patent application Ser. No. 991456, filed in Finland on Jun. 24, 1999.

BACKGROUND OF THE INVENTION

Electromagnetic radiation generated in a device may disturb either the device's own operation or the operation of some external device. Generally, the aim is to protect sensitive devices and interfering sources of electromagnetic radiation against radiation by encasing them in packages made from a conductive material and by sealing the packages so tight that no interfering electromagnetic radiation can penetrate the package. This type of or similar protection of devices against electromagnetic radiation is called EMI (electromagnetic interference) shielding.

One problematic area in EMI shielding is the sealing of junctions and joint surfaces comprised by devices, device cabinets and boxes. If the joint surfaces are not properly sealed with EMI gaskets, interfering electromagnetic radiation will quite easily pass through the joint. The best protection against interference is achieved when the joint surfaces are tightly sealed together galvanically. This means that resistance between the joint surfaces, so-called 'junction resistance', is as low as possible. However, it is difficult and expensive to manufacture such plane-like joint surfaces, where the surfaces are tightly attached to each other in every place galvanically. Therefore, solutions in which a good contact between the joint surfaces is not formed in every place but at certain distances along the whole length of the joint, are used for sealing joint surfaces. When the distance between the contacts formed is sufficiently short, electromagnetic radiation can no longer penetrate the joint in disturbing quantities. A sufficient contact distance depends on the frequency of the interfering radiation and the required attenuation level. Mechanical properties and the available space also affect the contact distance used. In connection with device cabinets and racks, a typical contact distance can be, e.g. 5–15 mm.

EMI sealing is required in various types of electric devices. Among others, EMI gaskets are used in device box and cabinet doors and apertures, as well as in partitions between different units inside device cabinets.

There are at least three types of gaskets that are most commonly used for EMI sealing. In one solution, a mantle is knitted from a conductive material around a resilient rubber compound or some other corresponding material. The mantle is knitted from a very thin wire that acts as a conductive fabric. When placed in between joint surfaces, these types of gaskets give an even contact but do not necessarily give a sufficient contact for EMI shielding due to the large contact area. They do not pierce through the surface, which is slightly oxidised or greasy. These types of gaskets may shed short pieces of wire, which can cause a short circuit after being passed on to a printed board. Neither do they endure friction and continuous wear.

In a second solution conductive particles are mixed inside a rubber-like sealing compound, the conductive particles forming a galvanic connection between joint surfaces when the joint surfaces are pressed together. However, the electroconductivity of these types of gaskets does not come near to that of, e.g. copper alloyed gaskets. Furthermore, the properties of these types of gaskets may change as they age.

A third solution is provided by spring-like gaskets bent from sheet metal. Their electroconductivity is good, but their manufacture is problematic. The manufacture of spring-like sheet metal gaskets requires expensive perforating and bending tools. In addition, the edges of the gaskets are sharp, whereupon one may hurt one's hand on them, and the length of the gaskets is limited to the length of the sheet used in their manufacture, which normally is about 70 cm, in which case a full-length gasket must be assembled from several pieces.

The most significant disadvantage of a spring-like sheet metal gasket is, however, its susceptibility to being damaged due to its poor elastic properties. The gasket has extremely accurate tolerance of compression. If joint surfaces are pressed together too little, the gasket placed in between them will leak, as it is called, i.e. let electromagnetic radiation significantly through it. If again joint surfaces are pressed too much, a permanent deformation will take place in the gasket and its compression force will no longer be sufficient. Also in this case, the joint will begin to leak.

FIG. 1 illustrates an EMI gasket presented in the Patent Publication U.S. Pat. No. 5,091,606, which comprises a helical spring made from a circular profiled wire and may comprise a layer made on top of the spring from a conductive and ductile material. When this type of gasket is placed in between the surfaces to be sealed and the surfaces are pressed against each other, a contact is formed between the surfaces. The gasket is intended for sealing shafts and other surfaces with a circular cross-section, and their circumferences. A disadvantage of these types of gaskets is a reasonably complex manufacturing process, as well as the difficulty of fitting the gasket into small spaces.

Typically, the surfaces to be sealed are made from oxidable materials, such as sheet metal, in which case when the surfaces oxidise the contact between the surfaces becomes weaker and EMI tightness will be lost. The contact also becomes weaker when dirt gets between the gasket and the surfaces to be sealed.

SUMMARY OF THE INVENTION

Now, an EMI gasket has been invented with the help of which the disadvantages presented above can be mitigated. It is characteristic of an elongated EMI gasket made from an electroconductive wire that the cross-section of said wire comprises a shape protruding from a specific basic cross-section.

Correspondingly, it is characteristic of a device according to the invention, the device comprising a first part, a second part, joined together, and in between them an EMI gasket made from an electroconductive wire for getting said first and second parts into contact and for preventing electromagnetic interference from penetrating the joint part between the first and second parts, that the cross-section of said wire comprises a shape protruding from a specific basic cross-section for the EMI gasket to press against at least one of the surfaces of said first and second parts for forming an electric contact.

The properties of the sealing wire affect the contact forming properties of the gasket made from it. According to the invention, the EMI gasket is made from a spring-like electroconductive wire the cross-section of which comprises a shape protruding from a specific basic cross-section, e.g. an angle or a rounded angle, for forming a contact with a joint surface. An EMI gasket according to the invention is in direct contact with the joint surfaces and with it a sharper contact with the joint surfaces is achieved than with gaskets according to prior art, which do not comprise protrusions. When pressing the surfaces to be sealed together, the protruding shapes of the EMI gasket press effectively against the joint surfaces. This being the case, a permanent contact is achieved at short distances between the joint surfaces, and electromagnetic radiation cannot penetrate the joint in disturbing quantities.

Other objects and features of the present invention will become apparent from the following detailed description considered in conjunction with the accompanying drawings. It is to be understood, however, that the drawings are intended solely for purposes of illustration and not as a definition of the limits of the invention, for which reference should be made to the appended claims.

BRIEF DESCRIPTION OF THE DRAWINGS

In the following, the invention will be explained in detail by referring to the enclosed drawings, in which.

DETAILED DESCRIPTION OF THE PRESENTLY PREFERRED EMBODIMENTS

Figure 1:
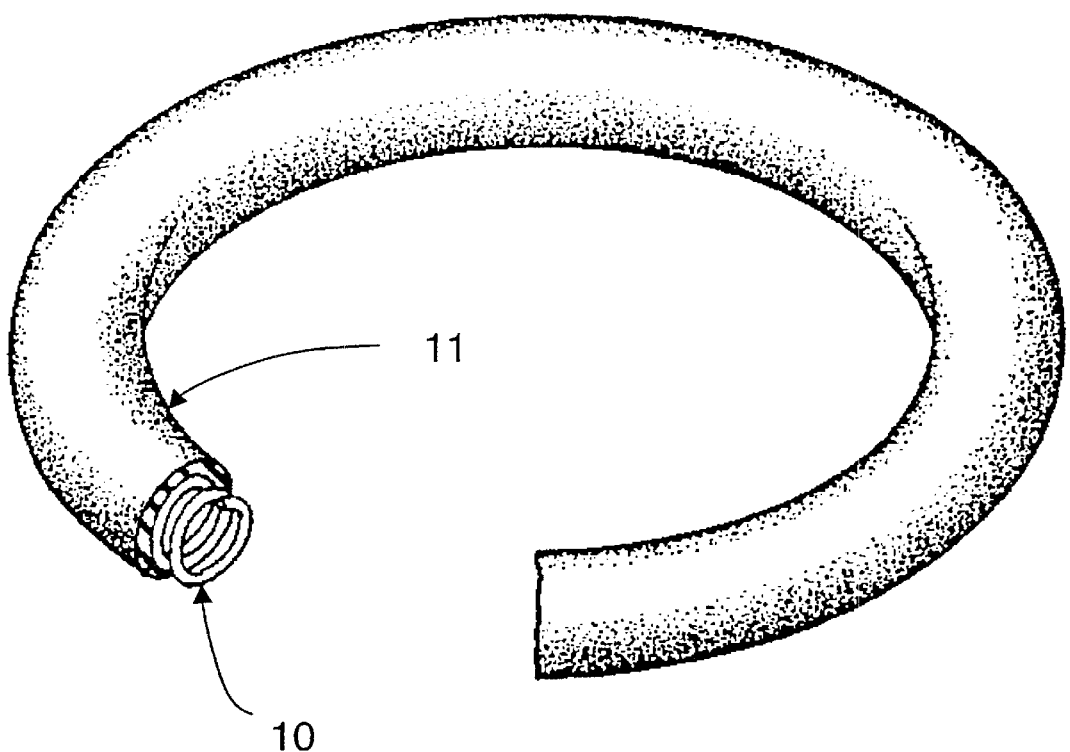
FIG. 1 shows an EMI gasket according to prior art.

FIG. 1 was described above in connection with the description of prior art. FIGS. 2a–2d show different types of cross-sections; profiles of sealing wire according to the invention. An EMI gasket is made from an electroconductive sealing wire by bending it in the appropriate shape depending on the use, e.g. in the shape of a spiral helical spring or a helical spring with a rectangular profile. Bending is not always necessary, but the sealing wire can also be used as an EMI gasket as such.

The basic cross-section of the sealing wire can be different in shape, e.g. in the shape of a circle, triangle, square, some other polygon, ellipse or some other corresponding geometric shape. According to the invention, the cross-section of the sealing wire comprises some shape protruding from the basic cross-section of the wire. The wire may have, e.g. one or more nodules, i.e. substantially rounded angles that protrude from the basic cross-section of the wire.

The shape that protrudes from the basic cross-section can also be an angle with its point cut off or an angle with a sharp point. Here, by an angle is meant the part of a surface that is bordered by the point of convergence of two divergent borderlines of said surface.

Figure 2A:
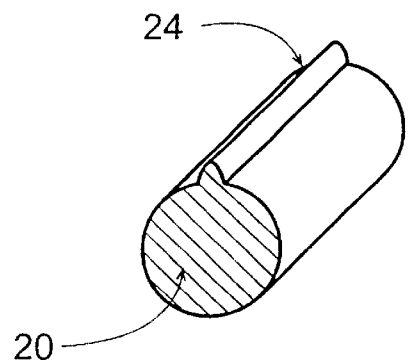
FIGS. 2a–2d show four cross-sectional profiles of a sealing wire according to the invention.
Figure 2B:
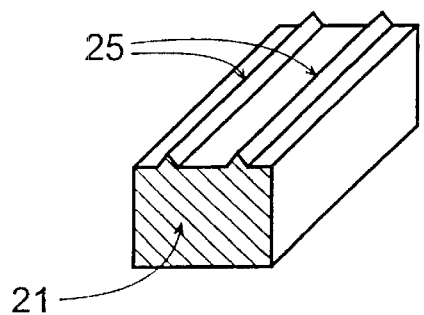
Figure 2C:
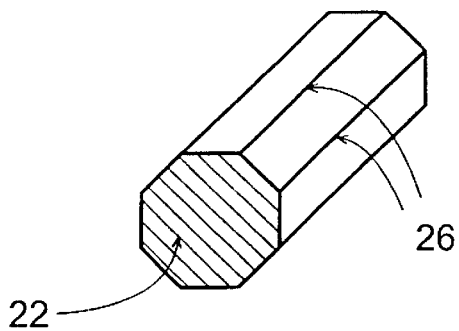
Figure 2D:
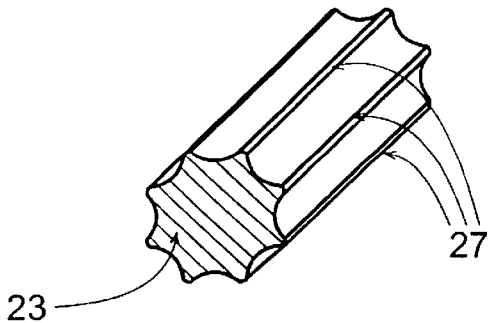

FIG. 2a illustrates the profile of a sealing wire, where a sealing wire 20 with a circular cross-section comprises a protrusion-like nodule 24 with a blunt point. FIG. 2b shows a wire 21 with a rectangular cross-section, which comprises two sharp nodules 25. FIG. 2c illustrates a sealing wire 22 with an octagonal cross-section, which comprises eight angles 26 with a sharp point. FIG. 2d shows a wire 23 with a star peak cross-section, which comprises eight sharp-edged tooth-like protrusions 27. In FIGS. 2a and 2d, the basic cross-section can be considered to be a circle and in FIG. 2b, a square.

When using an EMI gasket made from the sealing wire 20–23 presented above for EMI sealing, always some element of the sealing wire, e.g. a nodule or the sharp edge of a wire with a polygonal cross-section preferably presses against a joint surface forming a good electric contact with the joint surface.

An extremely good bite into the joint surface is achieved if the sealing wire 23 with a star peak cross-section (FIG. 2d) that comprises tooth-like points 27 is used as a sealing wire. Part of these teeth 27 of the sealing wire 23 with a star peak cross-section bite firmly on the joint surface irrespective of which side of the wire is pointing towards the joint surface each time. The cross-section may have three or more teeth 27. The more teeth 27 the structure has, the sharper they can be made. On the other hand, sharper peaks are less resistant to mechanical stress. Particularly effective contacts with the joint surface are achieved if the wire 23 is wound around its longitudinal axis (FIG. 5) before actually bending the wire to make an EMI gasket, e.g. in the shape of a helical spring. At the stage of manufacturing an EMI gasket, it is also possible to wind a wire with some other kind of profile, e.g. a smooth polygonal profile, around its longitudinal axis for adding sharp contact points.

Figure 3:
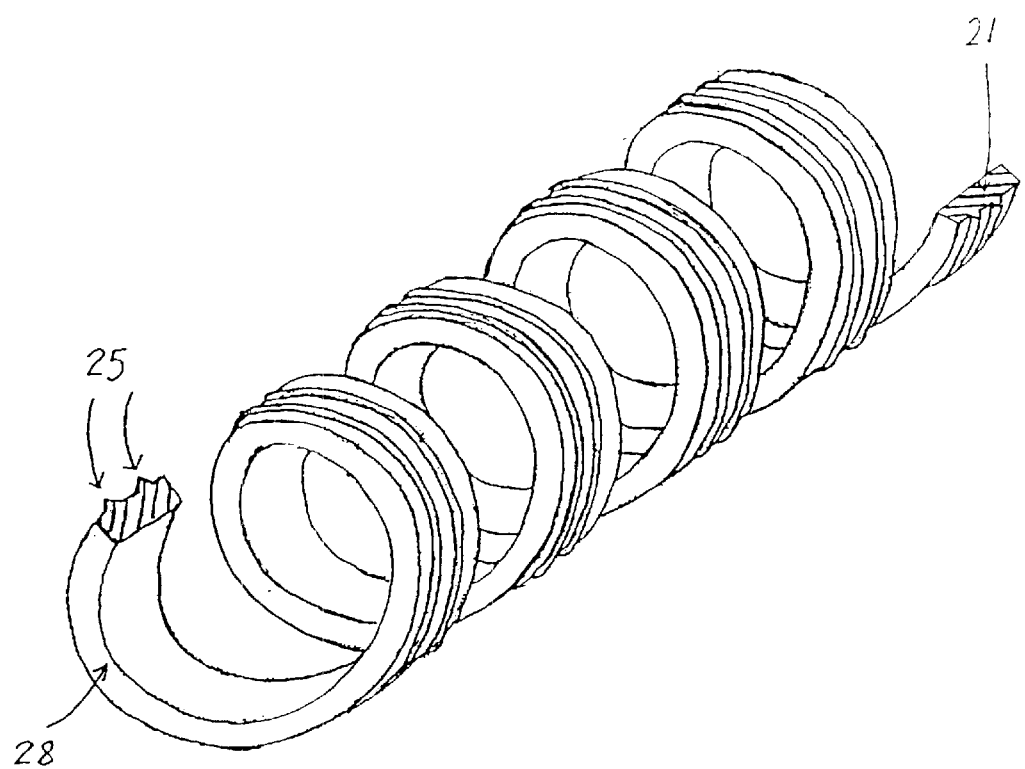
FIG. 3 shows an EMI gasket according to the invention.

FIG. 3 illustrates an EMI gasket 28 according to the invention, bent in the shape of a spiral, which is made from a wire 21 with a rectangular cross-section comprising two sharp nodules 25. The nodules 25 always point outwards from the structure, whereupon they easily bite into the joint surfaces. By changing the relation between the wire profile's thickness and width, spring gaskets with varying rigidity can be obtained.

Figure 4A:
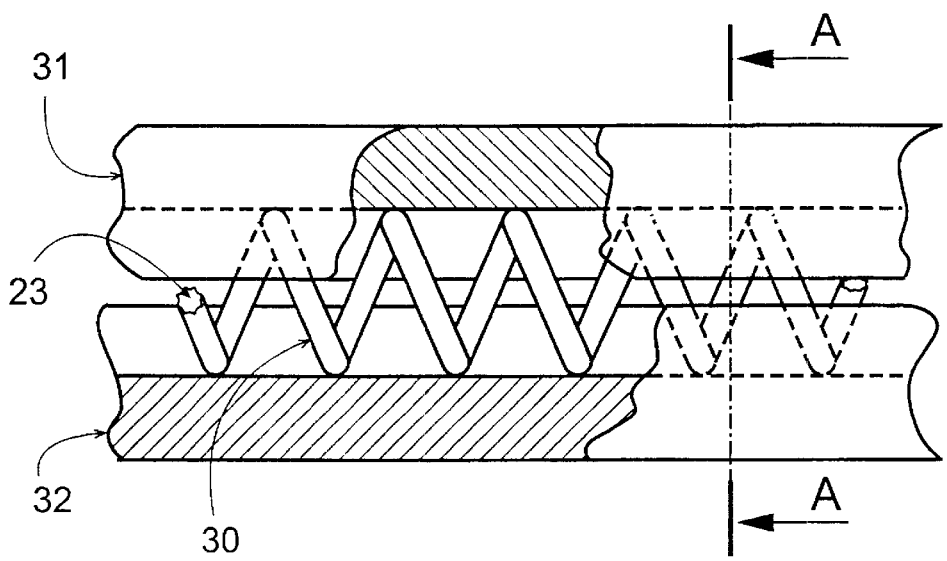
FIGS. 4a–4c show one way of EMI sealing according to the invention.
Figure 4B:
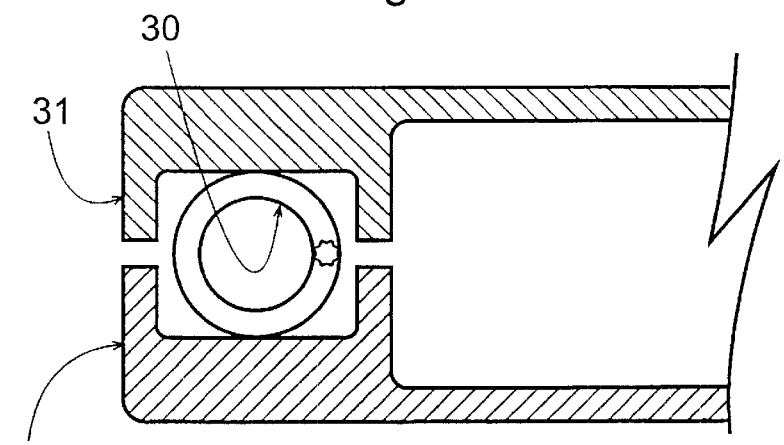
Figure 4C:
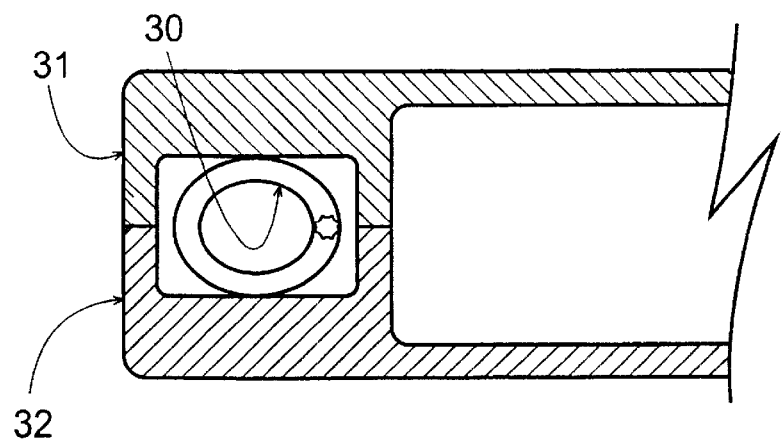

FIGS. 4a–4c are related to a first embodiment according to the invention, in which the joint between the inner part of a device cabinet and the external space of the cabinet is sealed EMI tight with an EMI gasket according to the invention. The device cabinet may belong, e.g. to a device that operates in some part of a mobile communication network, e.g. in a base transceiver station. The penetration of interfering electromagnetic radiation from inside the cabinet to outside the cabinet and from outside the cabinet to inside is prevented by placing the EMI gasket in the space between the cabinet parts and by pressing the parts against each other.

Figure 5:
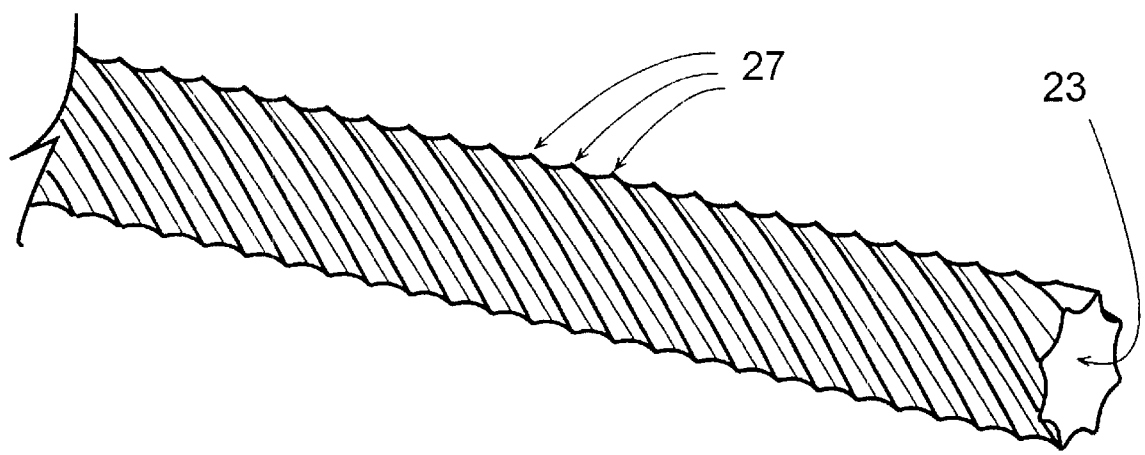
FIG. 5 shows a detail relating to the bending of a sealing wire.

The EMI gasket used can be bent in several different shapes but in this embodiment, it is bent in the shape of a helical spring by way of example. Here, a sealing wire 23 with a star peak cross-section, which is wound around its longitudinal axis, is used as a sealing wire (FIG. 5). For the sake of clarity, this detail is not shown in FIGS. 4a–4c. Alternatively, it is possible to use some other profile according to the invention presented above as the profile of the sealing wire.

The cabinet to be sealed is preferably made from an electroconductive material. The cabinet comprises a specific first part 31 and a specific second part 32. FIG. 4a illustrates a situation, where an EMI gasket 30 according to the invention is placed in the space between said first part 31 and said second part 32. The diameter of the gasket 30 is preferably so big that when the gasket is freely in between said first and second parts 31, 32, the parts cannot get into direct contact with each other. The cross-sectional diagram according to the section A—A made in FIG. 4a before pressing the joint surfaces against each other is shown in FIG. 4b.

When pressing the parts 31, 32 against each other, the EMI gasket placed between them will compress in the direction that is perpendicular to the longitudinal axis of the EMI gasket 30. This appears from FIG. 4c, which shows the cross-sectional diagram according to the section A—A after pressing.

The springback forces that act in the compressed EMI gasket 30 made from the wire 23 with a star peak cross-section tend to return the gasket into its original shape, whereupon some of the protrusions 27 with a tooth-like cross-section of the gasket 30 press tightly against the surfaces of said first part 31 and said second part 32 forming sharp electric contacts at short distances between the first part 31 and the second part 32 preventing interfering electromagnetic radiation from penetrating the produced joint. The distance between the contacts is typically 1–15 mm.

The EMI gasket 30 can be made from several different materials, e.g. from alloyed copper metal, stainless steel or other corresponding material. The gasket's electrical and mechanical properties, as well as manufacturability can be affected by the selection of the sealing material. The diameter of the wire used for the manufacture of the gasket 30 may vary, but typically it is approximately 0.3–5 mm. The diameter of the gasket 30 may be, e.g. 2–40 mm. The pitch of thread may be, e.g. 1–15 mm. The cross-sectional shape of the sealing wire is made by a wiredrawing machine, where the sealing wire is forced to pass through a forming nozzle. The forming nozzle is according to the desired cross-sectional shape, e.g. star peak cross-section, so that when passing through the nozzle the wire is pressed into the desired cross-sectional shape. At this same stage, after the sealing wire has achieved its correct cross-sectional shape, the wire can be wound around its own longitudinal axis, whereupon the wire becomes spiral in shape, as is shown in FIG. 5. After this, the wire is ready to be bent by a spring-making machine to make an EMI gasket in the desired shape, e.g. helical spring-like.

Figure 6:
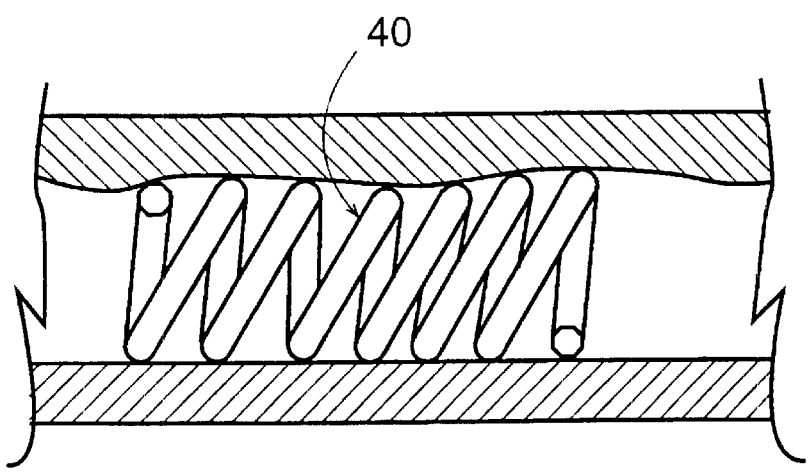
FIG. 6 shows an EMI gasket shaping on uneven surfaces according to the invention.

An EMI gasket 40, made by inclining the pitch of thread along the whole length of the helical spring-like EMI gasket in the same direction, is called the inclined helical spring-like EMI gasket 40. It suits well for sealing uneven joint surfaces, because its maximum compression, i.e. the length (of compression) that the gasket can compress is reasonably long. Therefore, the inclined helical spring-like EMI gasket 40 is able to shape well on uneven surfaces forming good contacts with the joint surfaces (FIG. 6). When using a wire with a nodular or polygonal profile as the sealing wire for an inclined gasket, it is possible to achieve more effective contacts than before with uneven surfaces, because the nodules also bite into those points of the surfaces to be sealed into which a wire with a circular cross-section according to prior art does not bite.

Figure 7A:
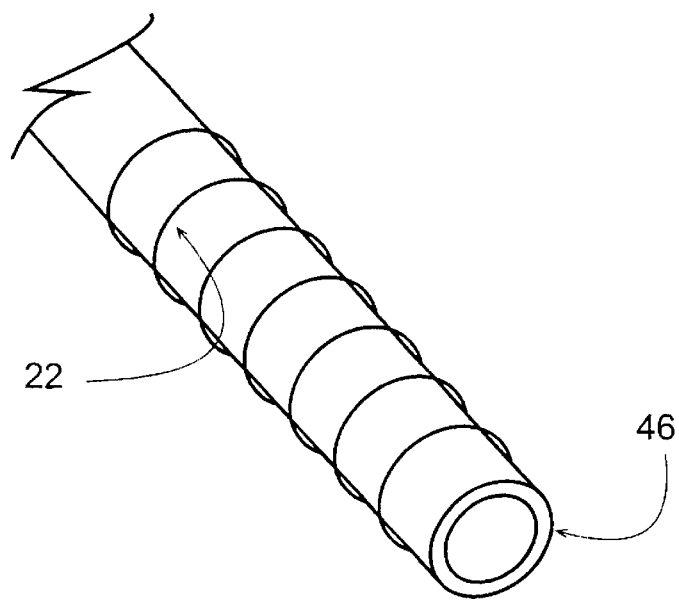
FIGS. 7a–7c show an EMI gasket wound around specific profiles.
Figure 7B:
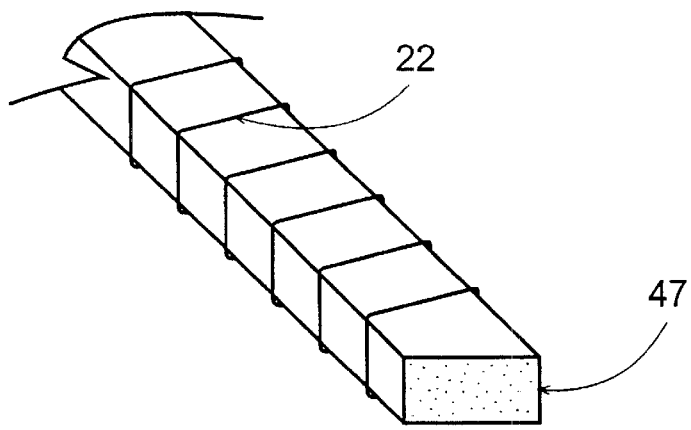
Figure 7C:
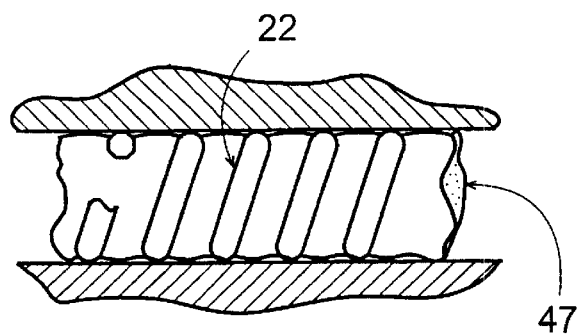

A sealing wire according to the invention can also be wound around some other profile. A wire 22 with, e.g. a polygonal profile made from an electroconductive material can be wound according to the invention, e.g. around a tube 46 made from silicon rubber or other flexible rubber-like material to make it helical spring-like in shape (FIG. 7a) or on top of a rectangular profile 47 made from rubber-like material (FIG. 7b). Thus, the sealing wire 22 can be made from a softer material than the gaskets presented above in this paper, because the profile 46 or 47, around which the sealing wire 22 is wound, supports the sealing wire with its elastic properties. The EMI gasket, which is made by winding the sealing wire 22 around the profile 47 also improves the dust tightness of the joint (FIG. 7c).

If there is a desire to make the EMI gasket 30, 40 ready in the desired shape, a rigid support wire placed inside the gasket can be utilised in bending the gasket. The support wire is first bent in the desired shape, e.g. in the shape of the edge of a component rack, after which the gasket is slipped on to the support wire. Finally, the gasket with the support wire is placed in the space reserved for it.

With the help of an EMI gasket according to the invention, more reliable EMI tightness is achieved than with a gasket according to prior art with, e.g. a circular cross-section, because gaskets according to the invention that comprise sharp elements also bite into places that, e.g. gaskets with a circular cross-section cannot reach. With an EMI gasket according to the invention, so firm contacts are formed with joint surfaces that the penetration of dirt and the formation of an insulating oxide layer between the EMI gasket and the joint surface becomes substantially more difficult.

This paper presents the implementation and embodiments of the invention with the help of examples. A person skilled in the art will appreciate that the present invention is not restricted to details of the embodiments presented above and that the invention can also be implemented in another form without deviating from the characteristics of the invention. The presented embodiments should be regarded as illustrative but not restricting. Thus, the possibilities of implementing and using the invention are only restricted by the enclosed claims, and the various options of implementing the invention as determined by the claims, including the equivalent implementations, also belong to the scope of the invention.

What is claimed is:

1. An elongated EMI (electromagnetic interference) gasket made from an electroconductive wire wherein:
    a cross-section of said wire comprises a protrusion that protrudes from a specific basic cross-section of said wire, the specific basic cross-section of said wire being a circle or a quadrangle, wherein the wire is in the shape of a helical spring.

2. The EMI gasket of claim 1, wherein the wire comprises threads, the pitch of which is inclined.

3. The EMI gasket of claim 1, wherein said wire is wound around a specific profile.

4. The EMI gasket of claim 1, wherein the protrusion that protrudes from said specific basic cross-section is an angled portion.

5. The EMI gasket of claim 1, characterised in that the protrusion that protrudes from said specific basic cross-section is an angled portion rounded at a point thereof.

6. The EMI gasket of claim 1, wherein the protrusion that protrudes from said specific cross-section is substantially in the shape of a tooth.

7. The EMI gasket of claim 1, wherein the wire is wound around a longitudinal axis thereof.

8. The EMI gasket of claim 1, wherein the wire is slipped around a specific support wire to enable installation of the EMI gasket in a place of use.

9. A device comprising a first part and a second part joined together, and an EMI (electromagnetic interference) gasket made from an electroconductive wire in between the first and second parts for causing said first and second parts to come into electric contact with each other and for preventing electromagnetic interference from penetrating a joining point between the first and second parts, wherein a cross-section of said wire comprises a protrusion that protrudes from a specific basic cross-section for the EMI gasket to press against at least one surface of said first part and at least one surface of said second part for forming an electric contact, the specific basic cross-section of said EMI gasket being a circle or a quadrangle, wherein the EMI gasket is in the shape of a helical spring.

10. The device of claim 9, wherein the EMI gasket is slipped around a specific support wire to enable installation of the EMI gasket in a place of use.

* * * * *